United States Patent
Camerlenghi et al.

(10) Patent No.: US 6,944,061 B2
(45) Date of Patent: Sep. 13, 2005

(54) SINGLE CELL ERASING METHOD FOR RECOVERING MEMORY CELLS UNDER PROGRAMMING DISTURBS IN NON VOLATILE SEMICONDUCTOR MEMORY DEVICES

(75) Inventors: Emilio Camerlenghi, Bergamo (IT); Giovanni Campardo, Bergamo (IT); Tecla Ghilardi, S. Paolo d'Argon (IT)

(73) Assignee: STMicroelectronics, S.r.l. (IT)

(*) Notice: Subject to any disclaimer, the term of this patent is extended or adjusted under 35 U.S.C. 154(b) by 0 days.

(21) Appl. No.: 10/724,022

(22) Filed: Nov. 26, 2003

(65) Prior Publication Data

US 2004/0233730 A1 Nov. 25, 2004

(30) Foreign Application Priority Data

Nov. 28, 2002 (EP) .............................................. 02425727

(51) Int. Cl.⁷ .............................................. G11C 16/04
(52) U.S. Cl. ............................ 365/185.29; 365/185.18; 365/185.12
(58) Field of Search ........................ 365/185.29, 185.18, 365/185.12, 185.33, 185.11

(56) References Cited

U.S. PATENT DOCUMENTS

| | | | | | |
|---|---|---|---|---|---|
| 5,753,953 | A | * | 5/1998 | Fukumoto | .................... 257/316 |
| 5,969,993 | A | | 10/1999 | Takeshima | ............. 365/185.29 |
| 6,118,705 | A | * | 9/2000 | Gupta et al. | ........... 365/185.33 |
| 6,178,117 | B1 | | 1/2001 | Cleveland | ............. 365/185.19 |
| 6,570,790 | B1 | * | 5/2003 | Harari | .................... 365/185.29 |
| 2002/0071309 | A1 | | 6/2002 | Miwa et al. | ........... 365/185.03 |
| 2004/0029335 | A1 | * | 2/2004 | Lee et al. | .................... 438/200 |

FOREIGN PATENT DOCUMENTS

| EP | 0932161 A1 | 7/1999 | ........... G11C/16/00 |
|---|---|---|---|
| WO | WO 01/15172 | 3/2001 | |

OTHER PUBLICATIONS

European Search Report, EP02425727, Nov. 21, 2003.

* cited by examiner

Primary Examiner—Huan Hoang
(74) Attorney, Agent, or Firm—Lisa K. Jorgenson; Paul F. Rusyn; Graybeal Jackson Haley LLP

(57) ABSTRACT

The present invention relates to a particular single cell erasing method for recovering memory cells under reading or programming disturbs in non volatile semiconductor memory electronic devices comprising cell matrix split in sectors and organized in rows, or word lines, and columns, or bit lines.

This kind of memory devices generally provides the application of a sector erasing algorithm with subsequent testing phase (erase-verify); but the method according to the present invention provides a bit by bit erasing by applying to each single word line a negative voltage used during the erasing of a whole sector and on the drain terminal of each single cell a programming voltage.

With this kind of selective bias it is possible to perform a single cell, or bit by bit, erasing, allowing all the cells in case under a reading or programming disturb increasing the original threshold value thereof to be recovered.

12 Claims, 4 Drawing Sheets

SINGLE CELL ERASING METHOD FOR RECOVERING MEMORY CELLS UNDER PROGRAMMING DISTURBS IN NON VOLATILE SEMICONDUCTOR MEMORY DEVICES

PRIORITY CLAIM

This application claims priority from European patent application No. 02425727.1, filed Nov. 28, 2002, which is incorporated herein by reference.

TECHNICAL FIELD

The present invention relates generally to a single cell erasing method for recovering cells under programming disturbs in non volatile semiconductor memory devices.

More specifically, but not exclusively, the invention relates to a method for recovering memory cells undergoing threshold variations with respect to an original value in Page-Flash non volatile memory devices. The following description is made with reference to this specific field of application for convenience of illustration only.

BACKGROUND

As it is well known in this specific field of application, one of the Flash memory reliability problems is linked to single bits shifting from the original threshold value as a consequence of the stresses they undergo during the memory device operating life.

For example, a memory cell being programmed at the logic value "0" and having a predetermined threshold can shift to a lower threshold after undergoing a stress during the programming phase.

In general, if a bit value has shifted to a lower threshold after undergoing a programming stress can be reprogrammed selectively and brought back to the initial threshold value, it is not so easy to bring a bit back to a lower threshold if the bit has previously moved toward higher threshold values. At present, the prior art provides no solutions allowing the erased bits whose threshold has increased and has been detected by an erase-verify phase to be selectively brought back within a distribution of values "1".

This shift to higher threshold values can occur for example during a reading disturb in electric programming and erasing flash memories.

This phenomenon has been noticed also in cells having undergone a programming drain stress in page/sector-programmed flash memories. Cell matrices of this kind are described for example in the U.S. Pat. No. 6,133,604.

The technical problem underlying the present invention is to provide an erasing method, having such characteristics as to reduce selectively the threshold value of memory cells whose threshold has increased, with respect to the original value, as a consequence of stress or disturbs occurred during their use. This would make the lifetime of memory devices incorporating cells which may be affected by this problem longer.

SUMMARY

A solutive idea underlying the present invention is to erase selectively bit by bit memory cells by applying on each single word line a negative voltage, already used when erasing a whole sector, and on the drain terminal of each single cell the programming voltage.

With this kind of selective bias it is possible to perform a single cell (or bit by bit) erasing, allowing all the cells eventually under a disturb increasing the original threshold value thereof to be recovered.

On the basis of this solution the technical problem is solved by a method as previously described and defined in the characterising part of the attached claim 1.

The features and advantages of the method according to aspects of the present invention will be apparent from the following description of an embodiment thereof given by way of non-limiting example with reference to the attached drawings.

DETAILED DESCRIPTION

Figure 1:
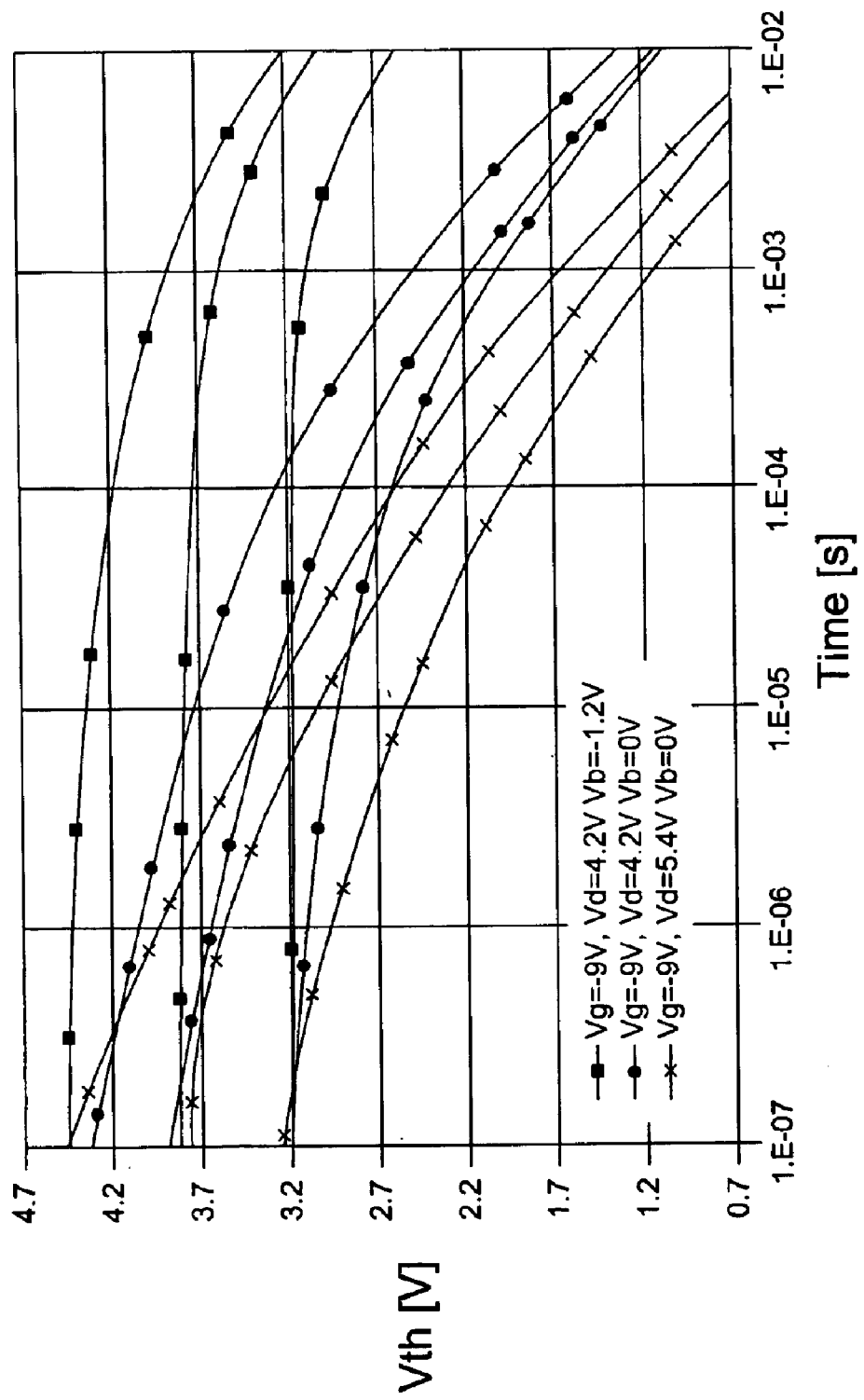
FIG. 1 shows in a voltage to time diagram a set of typical curves showing the evolution of the threshold voltage Vth of a memory cell when the bias voltages applied to the cell drain and bulk terminals change, for a predetermined negative gate voltage.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

The described embodiments of the present invention apply advantageously to a non volatile memory electronic device, for example of the Flash EEPROM type, being electrically programmable and erasable.

Memory device means any electronic system monolithically integrated on a semiconductor and incorporating a matrix of memory cells, organized in rows and columns, as well as circuit portions associated to the cell matrix and in charge of the addressing, decoding, reading, writing and erasing functions of the memory cell content.

A device of this kind can be just a memory chip integrated in a semiconductor of the non volatile EEPROM Flash type split in sectors and electrically erasable.

Each memory cell comprises a floating gate transistor having source, drain and control gate terminals.

Among the circuit portions associated to the cell matrix a row decoding circuit portion is provided, which is associated to each sector and supplied with specific positive and negative voltages generated internally in the integrated memory circuit by means of positive voltage boosters or charge pumps and regulated by means of corresponding voltage regulators.

The principles of the described embodiments of the present invention are applied to an integrated memory device wherein it is possible to decode the negative voltage on the single word lines, i.e. it is possible to apply selectively the negative voltage to the single word line. By way of example, but not exclusively, this is possible in PAGE Flash devices. The described embodiments of the invention overcome a possible threshold shift of some memory cells occurred after their programming due to programming disturbs or stresses.

Advantageously, the described embodiment of the invention provides an erasing by applying to a single word line the negative voltage used during the sector erasing phase.

Moreover, the drain terminal is biased to the programming voltage.

In a preferred, but not limiting, embodiment, the programming voltage is applied also to the cell bulk terminal, corresponding to an ipwell region.

This erasing method can be easily implemented on Page-Flash non volatile memories since they can already decode the negative voltage on word lines, but it can be extended to other memory families, provided that the possibility of decoding the negative voltage is introduced.

The Page-Flash memories, among other things, are exactly a family of products heavily exposed to the stress problem on drain terminals when the logic value stored in the cell is a logic "1".

The embodiments of the invention provide therefore a bias scheme allowing a selective erasing and recovery algorithm inside a memory.

According to an electrical analysis carried out by the Applicant on T7Y technology memory cells it is possible to erase by applying to the gate terminal of a given cell the voltage used during the erasing of a whole sector (−9V) and to the drain terminal of the same cell the voltage used during programming (+4.2V). The other cell terminals are kept at ground potential.

A possible negative substrate bias, i.e. of the cell bulk region, by using the voltage used during programming (−1.2V), allows maybe this erasing operation to be accelerated.

On the basis of what has been previously disclosed, it is evident that this kind of erasing occurs not only as a result of Fowler-Nordheim tunnelling, but also through the injection of gaps in the floating gate region. These gaps are produced by multiplication in the drain region.

FIG. 1 shows a voltage to time diagram illustrating different erasing curves for different combinations of drain voltage Vd and bulk voltage Vb.

Measures refer to a same single cell, realized preferably in T7Y technology. Measures are repeated starting from different threshold values Vth.

This applicable voltage scheme allows the cells to be erased bit by bit in arrays or matrixes of FLASH cells which are generally erasable only by sector.

It is interesting to notice that the physical erasing mechanism provided here does not require necessarily a junction profile optimization, for example an additional phosporus implant, which moreover would not be compatible with the gate size of the present generation FLASH cells.

By way of non exclusive example, the way the method of the described embodiment of the present invention is applied in Page-Flash memories will now be described.

The case of the recovery of cells programmed at a logic value "1" (low threshold) and undergoing a programming disturb will be analysed first.

The above-described selective erasing method can be used to face the drain stress problem which is particularly critical for the structure of a PAGE array or matrix.

In fact, for these kinds of Flash memories, during the programming phase the cells belonging to the selected row undergo a prolonged drain stress due to the following biases: Vd=Vd program, Vb=Vb program, Vg=Vs=0V. This bias can be extended for a longest overall time of:

[# cycles max/byte]×[# cells belonging to column i]×[program time]

Figure 2:
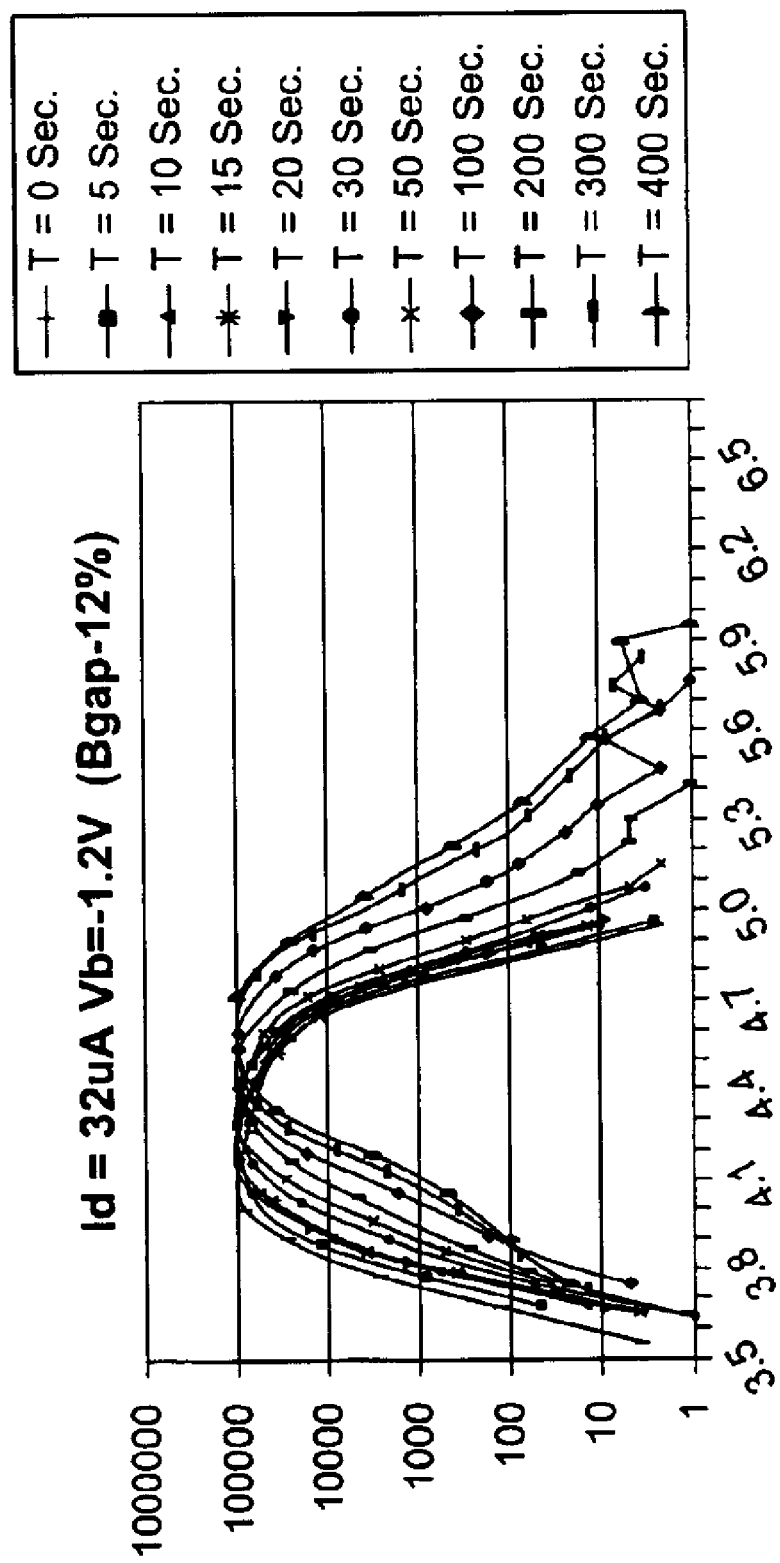
FIG. 2, illustrating the problem, shows in a voltage to time diagram the evolution of the threshold voltage Vth distribution of a whole memory sector as a consequence of a stress on the cell drain terminal.

The problem is clearly shown by drain stress measures on a FLASH array, as shown in FIG. 2.

FIG. 2 shows the evolution of a threshold voltage Vth distribution of a 0.5 Mbit cell sector, starting from a pattern wherein all the cells have been programmed at the logic value "1".

The bias values are Vd=4.2V; Vb=−1.2V; Vg=0V.

The Page-Flash cell array is already provided with a row decoding allowing the negative voltage to be brought on the single word line.

Figure 3:
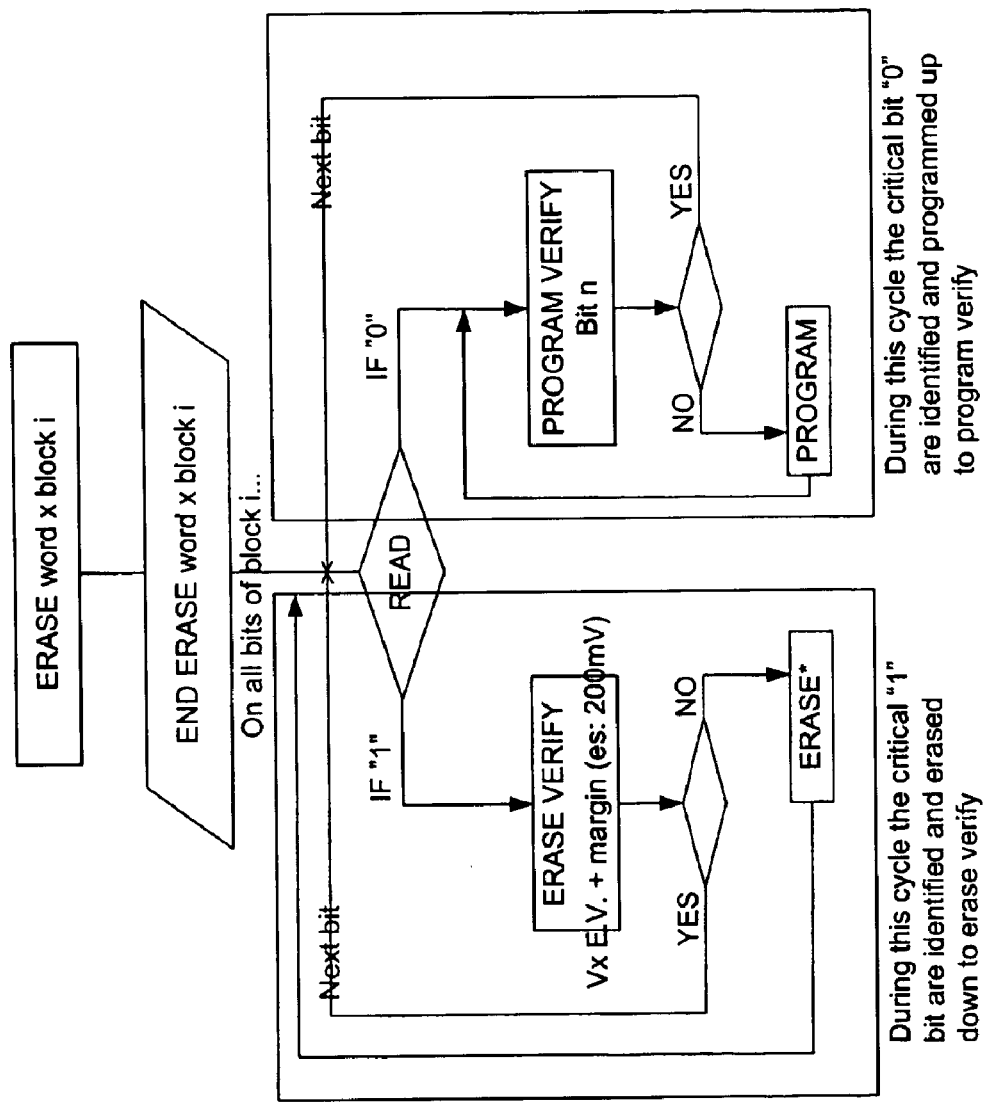
FIG. 3 is a schematic block scheme illustrating the erasing method according to and embodiment of the present invention as a sequence of typical phases of a flow chart.
Figure 4:
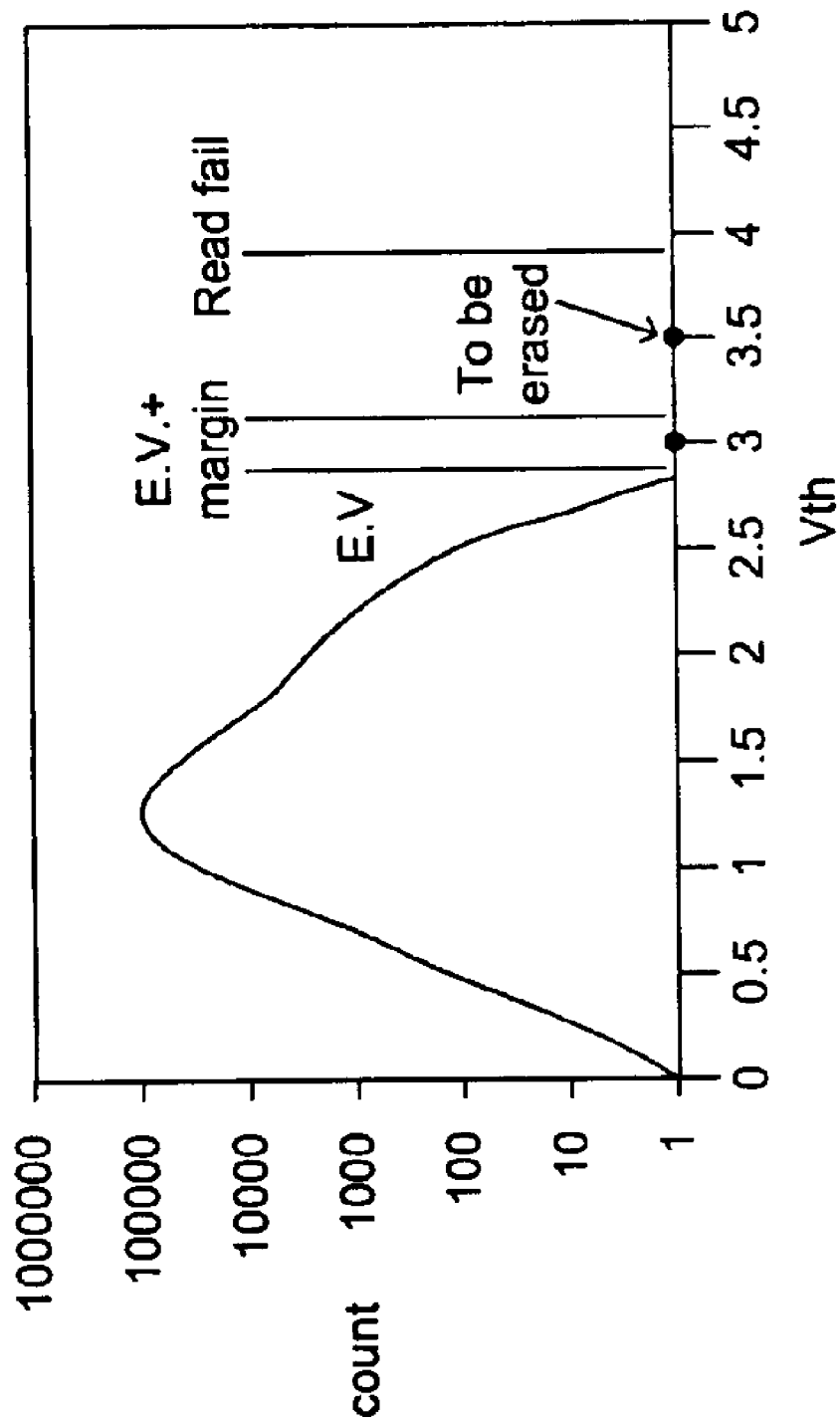
FIG. 4 shows a distribution of erased cells with the erase-verify levels (EV), the testing level for the bits to be recovered by selective erasing (EV+margin), and, finally, the reading failure level (Read Fail).

Essentially, in order to implement a method according to an embodiment of the present invention, it is sufficient to insert into the already well-established erasing algorithm, shown by the block scheme of FIG. 3, a new phase described hereafter:

A search of the bits affected by drain stress, but still verified in the state "1", is performed at first into a selected block. Essentially, it is a question of finding those bits, i.e. those cells, whose threshold voltage Vth is slightly above the erase-verify (see FIG. 4).

These bits are identified through a testing with a voltage reference corresponding to the erase-verify voltage+a margin, for example 200 mV.

This margin must be high enough in order to be able to take into account the indeterminacy of the erase-verify operation. However, in the meantime, it must be small enough to allow the bits shifting to a higher threshold to be detected before they cause a "1" reading failure.

Afterwards, a drain selective erasing of those bits which have failed after the previous reading phase (verify) allows these bits to be brought back within the distribution of logic values "1".

Finally, a further standard testing, through the erase-verify phase, allows to verify the erasing occurred and that the actual threshold voltage Vth is within the erased distribution.

Obviously, the algorithm provided has a longer duration than the simple erasing algorithm; but the overall duration of the additional phase does not exceed one millisecond (ms).

Suppose in fact that the block testing phase requires in the worst case, wherein all the cells are in the logic state "1", about 0.6 ms.

This value is obtained in fact by supposing to have blocks of 512 rows and 32 columns; each testing requires about 40 ns, resulting in 40 ns×512×32=0,6 ms.

The recovery phase must be added to this duration, therefore a duration of 10–100 us can be estimated for each cell, as indicated by the times of FIG. 1. It is reasonable to think that the same operation is faster for cells with Page-Flash architecture, since these cells are optimised for the erasing.

Since the recovery algorithm is repeated at each erasing, it can be assumed that only a few cells need this erasing pulse. Therefore the overall duration of the additional phase (testing+recovery) is less than a millisecond.

The method according to the described embodiment of the invention solves efficiently the serious problem of the memory cell threshold drift in consequence of reading disturbs or programming stress and it allows several cells which would be permanently in a fail condition to be recovered.

The described embodiments of a non volatile memory may be utilized in a variety of different types of electronic systems, such as a computer system.

What is claimed is:

1. A single cell erasing method for recovering memory cells under reading or programming disturbs, in non volatile semiconductor memory electronic devices comprising cell matrix split in sectors and organized in rows, or word line, and columns, or bit lines, of the type providing the application of a sector erasing algorithm with subsequent testing phase (erase-verify), wherein it provides a bit by bit erasing by applying to each single word line a negative voltage used during the erasing of a whole sector and on the drain terminal of each single cell a programming voltage, the method further providing a bias to a negative voltage value of the cell substrate or of the cell bulk terminal to increase a drain junction bias and enhance impact ionization at a drain junction in order to accelerate the generation of hot holes to be injected into a floating gate.

2. Method according to claim 1, wherein it is applied to cells having a higher threshold than the original one.

3. Method according to claim 1, wherein it provides initially a search phase of which cells have a higher threshold voltage than the original value and a subsequent application phase of said bit by bit erasing.

4. Method according to claim 1, wherein a subsequent erase-verify phase is performed after the bit by bit erasing.

5. Method according to claim 1, wherein said cell matrix is a Page-Flash array.

6. A flash memory device including a memory-cell array, the memory cell array being arranged in sectors with each sector including a portion of the memory cells contained in the array, each flash memory cell in the array having a control terminal coupled to a word line and a drain terminal coupled to a bit line, the memory device being operable to erase selected memory cells in a sector by applying a negative programming voltage on a selected word line of the sector and applying a positive voltage on a selected bit line of the sector of memory cells, and wherein the memory device is further operable to determine which memory cells in the sector have a threshold voltage greater than a threshold value and to apply the negative programming voltage and positive voltage to all memory cells in the sector determined to have threshold voltages greater than the threshold value, and wherein the memory device is further operable to bias at a negative voltage value a cell substrate or of the cell bulk terminal to increase a drain junction bias and enhance impact ionization at a drain junction in order to accelerate the generation of hot holes to be injected into a floating gate.

7. The flash memory device of claim 6 wherein the memory-cell array comprises a page-flash array.

8. The flash memory device of claim 6 wherein the memory device is further operable to apply to each memory cell determined to have a threshold voltage greater than the threshold value a test voltage having a value equal to an erase-verify voltage plus a voltage margin.

9. An electronic system, comprising:

a flash memory device, including,
a memory-cell array, the memory cell array being arranged in sectors with each sector including a portion of the memory cells contained in the array, each flash memory cell in the array having a control terminal coupled to a word line and a drain terminal coupled to a bit line, the memory device being operable to erase selected memory cells in a sector by applying a negative programming voltage on a selected word line of the sector and applying a positive voltage on a selected bit line of the sector of memory cells, wherein the memory device is further operable to determine which memory cells in the sector have a threshold voltage greater than a threshold value and to apply the negative programming voltage and positive voltage to all memory cells in the sector determined to have threshold voltages greater than the threshold value, and wherein the memory device is further operable to bias at a negative voltage value a cell substrate or of the cell bulk terminal to increase a drain junction bias and enhance impact ionization at a drain junction in order to accelerate the generation of hot holes to be injected into a floating gate.

10. The electronic system of claim 9 wherein the system comprises a computer system.

11. The electronic system of claim 9 wherein the memory-cell array comprises a page-flash array.

12. The electronic system of claim 9 wherein the memory device is further operable to determine which memory cells in the sector have a threshold voltage greater than a threshold value and to apply the negative programming voltage and positive voltage to all memory cells in the sector determined to have threshold voltages greater than the threshold value.

* * * * *